United States Patent [19]

Takano et al.

[11] 4,066,986
[45] Jan. 3, 1978

[54] TRAPPED ENERGY PIEZOELECTRIC FILTER

[75] Inventors: Katsuyoshi Takano, Tokyo; Masafumi Matsumoto, Kawagoe; Kimihiko Orikasa, Sakado, all of Japan

[73] Assignee: Toko, Inc., Tokyo, Japan

[21] Appl. No.: 745,750

[22] Filed: Nov. 29, 1976

[30] Foreign Application Priority Data

Dec. 1, 1975 Japan .................. 50-143690

[51] Int. Cl.² .............. H03H 9/04; H03H 9/20; H03H 9/32
[52] U.S. Cl. .................. 333/72; 310/321; 310/358; 310/9.8; 310/366
[58] Field of Search ............ 333/72, 71; 310/8, 8.2, 310/8.3, 9.5, 9.7, 9.8

[56] References Cited

U.S. PATENT DOCUMENTS

| | | | |
|---|---|---|---|
| 3,638,146 | 1/1972 | Takaku et al. | 333/72 |
| 4,013,982 | 3/1977 | Wood et al. | 333/72 |

Primary Examiner—Alfred E. Smith
Assistant Examiner—Marvin Nussbaum
Attorney, Agent, or Firm—Sughrue, Rothwell, Mion, Zinn and Macpeak

[57] ABSTRACT

A trapped energy type of piezoelectric filter includes a polarized ceramic wafer 9, input and output electrodes 11, 13 secured to one major surface of the wafer and spaced from each other by a constant width gap, and a ground electrode 15 secured to the opposite major surface underlying the input and output electrodes. The configuration of the ground electrode is made symmetrically concave or convex about its longitudinal axis in varying degrees to thereby control the band pass width, the symmetry of the filter characteristic about a center frequency, and eliminate peak ripples.

6 Claims, 13 Drawing Figures

TRAPPED ENERGY PIEZOELECTRIC FILTER

BACKGROUND OF THE INVENTION

1. Field of the Invention

The present invention relates to piezoelectric filters of the trapped energy type, which may have pass bands of varying widths and improved symmetry about a center frequency.

2. Description of the Prior Act

The prior art will be described with reference to FIGS. 1-3 of the accompanying drawings. FIG. 1 is a top or plan view of a piezoelectric filter of the prior art, FIG. 2 is a sectional side view thereof, and FIG. 3 shows a characteristic curve for such a prior art filter.

Generally, a piezoelectric filer of the trapped energy type comprises a piezoelectric wafer 1 made of, for example, a polarized ceramic material, input and output electrodes 3, 5, and a ground electrode 7. The input and output electrodes are secured to one major surface of the piezoelectric wafer with their adjacent edges spaced apart by a continuous, constant width gap, and the ground electrode is secured to the other major surface of the wafer opposite to and underlying the input and output electrodes. The configuration of the ground electrode is substantially the same as the combined configuration of the input and output electrodes. This type of filter makes use of the fact that the oscillating energy within the wafer is generally confined to the portion thereof where the input and output electrodes and the ground electrode face each other and is unlikely to propagate out of or spill over the edge portions of the wafer. Such a three-terminal piezoelectric filter oscillates in two modes, as indicated by curves A and B in FIG. 2, respectively called the symmetric or 110 mode and the antisymmetric or 210 mode. In the symmetric mode, the oscillating electric charge distribution is concentrated at the gap between the input and output electrodes; in the latter mode, the charge distribution is concentrated at the center portions of the input and output electrodes. The relationship between the resonant impedance of the symmetric mode $Z_1$ and that of the antisymmetric mode $Z_2$ is such that $Z_1 < Z_2$, which results in the filter characteristic shown in FIG. 3. Such a curve departs from the optimum filter characteristic in that it has a peak ripple, has a non-uniform band pass width, and is unsymmetrical about the center frequency $f_o$.

Attempts have been made to achieve a desired band pass width by appropriately changing the dimensions of the input, output and ground electrodes, designated V and W in FIG. 1. Such attempts have been found to vary the impedance characteristics of both of the two oscillation modes, however, and to shift the center frequency from the desired value, without substantially affecting the band pass width. Furthermore, it has been found extremely difficult to vary the band pass width while still maintaining the symmetrical distribution of each mode.

SUMMARY OF THE INVENTION

The objects of the present invention, whose implementation is described in detail hereinafter, include the provision of a filter wherein:

a. The band pass width can be varied,
b. The band pass width can be made substantially symmetrical about the center frequency,
c. The input and output impedances can be varied,
d. Peak ripple can be reduced in the case of a wide band filter, and
e. The group delay characteristic can be improved in a wide band filter.

The foregoing disadvantages attendant with the prior art filter are effectively overcome and eliminated by the present invention, according to which a trapped energy type of piezoelectric filter includes a polarized ceramic wafer, input and output electrodes secured to one major surface of the wafer and spaced from each other by a constant width gap, and a ground electrode secured to the opposite major surface underlying the input and output electrodes. The configuration of the ground electrode is made symmetrically concave or convex about its longitudinal axis in varying degrees to thereby control the band pass width, the symmetry of the filter characteristic about a center frequency, and eliminate peak ripples.

DETAILED DESCRIPTION OF THE PREFERRED EMBODIMENTS

Figure 4:
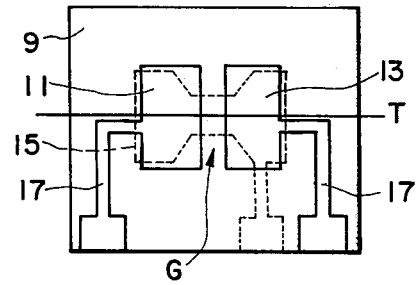
FIG. 4 shows a top or plan view of an embodiment according to the present invention.

Referring to FIG. 4, a first embodiment of the present invention comprises a piezoelectric wafer 9 made of a polarized ceramic material, input and output electrodes 11, 13 secured to one major surface of the wafer and spaced apart from each other by a constant width gap G, a ground electrode 15 secured to the opposite major surface of the wafer and underlying the input and output electrodes, and individual electrical leads 17 for each of the electrodes. The ground electrode is symmetrical with respect to both a center line T and the gap G between the input and output electrodes.

The ground electrode is necked down or pinched in the middle to be wider in the vicinity of the centers of the input and output electrodes and narrower in the vicinity of the gap G. The widened portions correspond to the areas of the most concentrated oscillating electric charge in the antisymmetric mode, and the narrow portion corresponds to the charge concentration area in the symmetric mode.

In such a filter construction, the narrowed portion of the ground electrode adjacent the area of heaviest electric charge concentration in the symmetric mode is relatively small, whereby the charge distribution per se is small in this area in comparison with that of the prior art filter. The charge distribution for the antisymmetric mode is changed very little, however, since the width of the ground electrode is not appreciably decreased in the areas underlying the centers of the input and output electrodes. Thus, it is possible to independently vary the electric charge distributions of both of the oscillation modes by changing the configuration of the ground electrode. More specifically, by narrowing the width of the ground electrode in the gap area, the impedance curve for the symmetric mode is moved from the dotted line S' in FIG. 7 to the line S, so that it draws closer to the impedance curve R of the antisymmetric mode. As a result, the band pass width becomes narrower.

Figure 1:
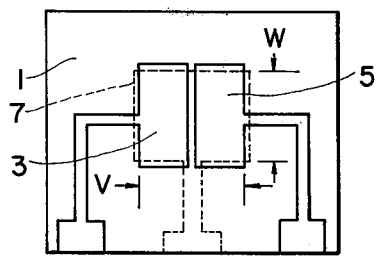
FIG. 1 shows a top or plan view of a conventional piezoelectric filter.
Figure 2:
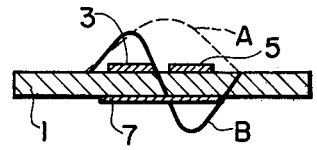
FIG. 2 shows a sectional side view thereof.
Figure 3:
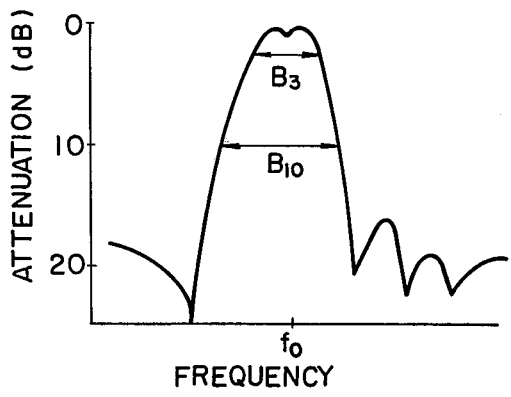
FIG. 3 shows a characteristic curve of the prior art filter.
Figure 5:
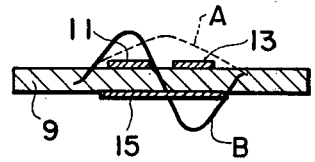
FIG. 5 shows a sectional side view of the filter shown in FIG. 4.
Figure 6:
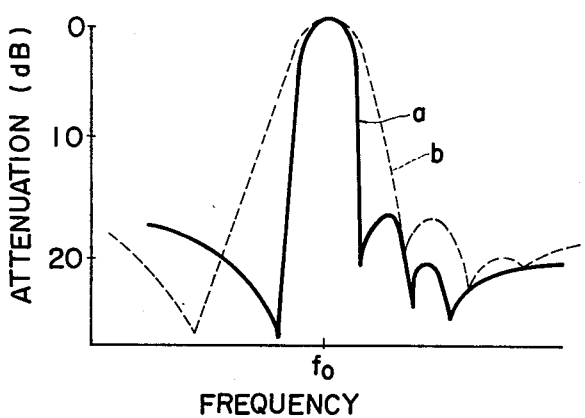
FIG. 6 shows a characteristic curve for the filters shown in FIGS. 4 and 8.

The oscillating electric charge distribution for the filter embodiment of FIG. 4 is indicated by curves A and B in FIG. 5, and the narrowed band pass characteristic is shown in FIG. 6 by line $a$. In FIG. 6 the band pass width at the 10db attenuation level is seen to be narrower than the 10db width shown in FIG. 3 for the conventional or prior art filter.

From the foregoing, it can be seen that the band pass width of a piezoelectric filter is capable of being narrowed by narrowing the width of the ground electrode at the area of maximum charge concentration in the symmetric mode relative to the width of the electrode at the areas of heaviest charge concentration in the antisymmetric mode.

Figure 7:
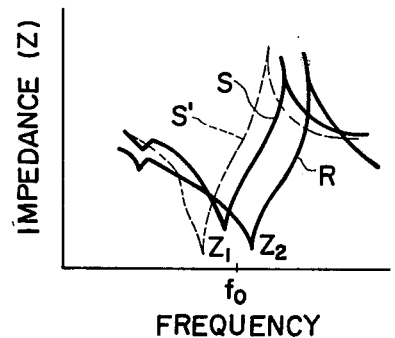
FIG. 7 shows impedance characteristic curves according to the invention.

Such narrowing also varies the impedance curve for the symmetric mode, as shown in FIG. 7. As can be seen therefrom, the resonant impedance of the symmetric mode $Z_1$ is greater than that of the antisymmetric mode $Z_2$ (the curve R approaches closer to the abscissa than the curve S), and thus the resonant impedance values can also be varied.

Figure 8:
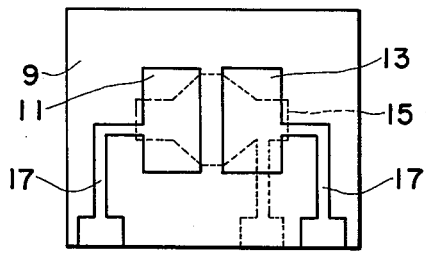
FIGS. 8, 9, and 10 show a top or plan view, a sectional side view, and the impedance characteristic curve, respectively, of another embodiment of the invention.
Figure 9:
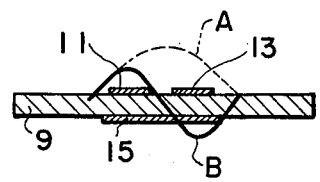
Figure 10:
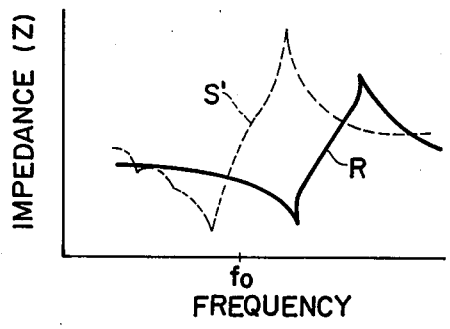

FIG. 8 shows another embodiment of the invention wherein the ground electrode is relatively widened in its center at the gap area and narrowed at its ends underlying the central areas of the input and output electrodes, which has the effect of altering or changing the electric charge distribution within the wafer, i.e. it reduces the electric charge distribution or magnitude in the antisymmetric mode, as shown by curve B in FIG. 9, and the impedance curve for the antisymmetric mode moves from R to R' in FIG. 10, i.e. it moves farther away from the impedance curve S' of the symmetric mode, which remains relatively stationary. The filter characteristic for the embodiment of FIG. 8 is shown by the dotted line $b$ in FIG. 6, from which it can be seen that the band pass is wider than that of the prior art filter shown in FIG. 3. Furthermore, the impedance curve varies such that the resonant impedance in the symmetric mode $Z_1$ becomes less than that of the antisymmetric mode $Z_2$, conversely to the curves shown in FIG. 7.

Accordingly, it is possible to vary the band pass of a piezoelectric filter by changing the configuration of the ground electrode in the manners described above. It is also possible to independently vary the resonant impedances of the symmetric and the antisymmetric modes, as a result of which any peak ripples appearing in the broad band filter characteristic can be eliminated and the symmetry thereof about a center frequency can be improved.

Figure 11:
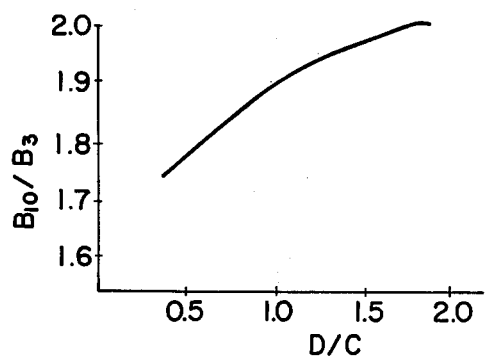
FIG. 11 shows the relationship between the ratio of the ground electrode dimensions, i.e., D/C, and the band pass width.
Figure 12:
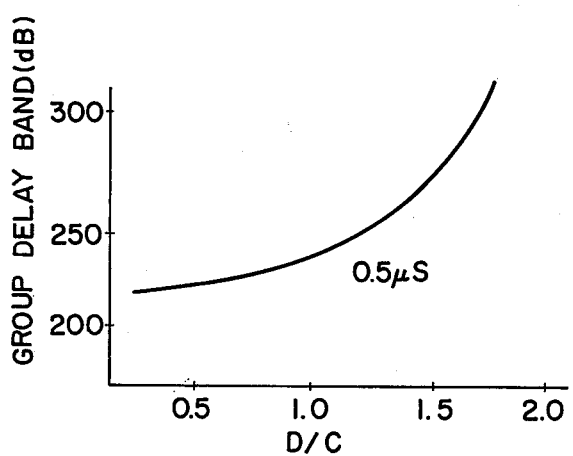
FIG. 12 shows the relationship between the ratio D/C and the group delay band width.

Applicant conducted experiments employing a piezoelectric wafer made of lead titanate zirconate ceramic having a thickness of 0.2 mm, wherein a wafer of 5 mm × 5 mm was polarized. Recutangular input and output electrodes of 1 mm × 0.4 mm were secured to one major surface of the wafer, and a ground electrode having "outermost" dimensions of 1.15 mm × 0.6 mm was secured to the opposite surface thereof. The gap width between the input and output electrodes was 0.3 mm. The ratio of the width (D) of the ground electrode at the area of maximum charge concentration in the symmetric mode to its width (C) at the areas of maximum charge concentration in the antisymmetric mode, i.e. D/C, was varied from 0.4 to 1.6, and the ratio of the resulting band pass widths at 3 dB ($B_3$) and 10 dB ($B_{10}$), i.e. $B_{10}/B_3$ was measured. The curve obtained is shown in FIG. 11. Further, group-delay values at 0.5 μ second were measured as a function of D/C, and the results obtained are plotted in FIG. 12. As may be seen, the group delay band width is particularly favorable at D/c ratios greater than 1.0, which adds to the attractiveness of the broad band filter shown in FIG. 8. The group delay band is still acceptably wide, however, even for a narrow band filter as shown in FIG. 4, i.e., D/C < 1.

Figure 13:
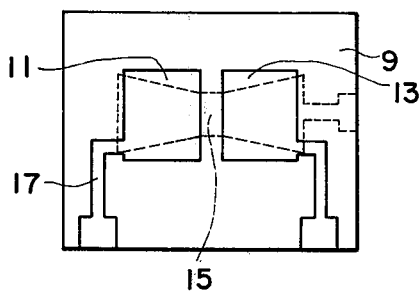
FIG. 13 shows a further, practical embodiment of the present invention.

In some applications of the present invention, it may be preferrable to vary the width of the ground electrode gradually rather than sharply, to minimize disturbances to the symmetric and antisymmetric oscillation modes and to minimize the generation of higher-order modes of oscillation. The configuration or width of the ground electrode may, for example, be changed in a smoothly curved manner as shown in FIG. 13.

The D and C widths of the ground electrode may be varied widely and in a number of different manners or configurations, whereby filters may be designed within a broad range in accordance with desired band pass widths and impedance characteristics.

While the invention has been described in detail and with reference to specific embodiments thereof, it will be apparent to one skilled in the art that various changes and modifications can be made therein without departing from the spirit and scope thereof.

What is claimed is:

1. In a trapped energy type of electrical band pass filter including a polarized piezoelectric wafer, input and output electrodes secured to one major surface of the wafer, having like planar configurations, and spaced apart from each other at their adjacent edges by a constant width gap, and a planar ground electrode secured to the opposite major surface of the wafer and generally underlying the input and output electrodes, the improvements characterized by:
   a. The configuration of the ground electrode being symmetrical about a longitudinal center line passing through the centers of the input and output electrodes, and about a transverse center line passing through the gap, and
   b. The width $W_1$ of the ground electrode in the area underlying the gap being different from the width $W_2$ thereof in the area underlying the center portions of the input and output electrodes.

2. An electrical band pass filer as defined in claim 1, wherein $W_1$ is greater than $W_2$.

3. An electrical band pass filter as defined in claim 1, wherein $W_2$ is greater than $W_1$.

4. An electrical band pass filter as defined in claim 1, wherein the width of the ground electrode changes from $W_1$ to $W_2$ in a gradual, smoothly curved manner.

5. An electrical and pass filter as defined in claim 2, wherein the width of the ground electrode changes from $W_1$ to $W_2$ in a gradual, smoothly curved manner.

6. An electrical band pass filter as defined in claim 3, wherein the width of the ground electrode changes from $W_1$ to $W_2$ in a gradual, smoothly curved manner.

* * * * *